United States Patent [19]

Smith

[11] Patent Number: 5,075,960

[45] Date of Patent: Dec. 31, 1991

[54] ELECTRICAL PIN PULLING TOOL

[76] Inventor: Christopher A. Smith, 12006 A. Barksdale Dr., Omaha, Nebr. 68123

[21] Appl. No.: 723,567

[22] Filed: Jul. 1, 1991

[51] Int. Cl.[5] .............................................. H05K 3/30

[52] U.S. Cl. ...................................... 29/739; 29/747; 29/758; 29/764

[58] Field of Search ................ 29/739, 747, 758, 764, 29/278

[56] References Cited

U.S. PATENT DOCUMENTS

| | | | |
|---|---|---|---|
| 3,074,155 | 1/1963 | Cootes et al. | 29/206 |
| 3,218,695 | 11/1965 | Fisher | 29/203 |
| 3,279,044 | 10/1966 | Roper | 29/206 |
| 3,621,555 | 11/1971 | Cowmeadow | 29/203 |
| 3,840,969 | 10/1974 | Landis | 29/278 |
| 4,186,482 | 2/1980 | Koppensteiner et al. | 29/622 |
| 4,377,906 | 3/1983 | Bertellotti et al. | 29/747 |
| 4,389,770 | 6/1983 | Bocinski et al. | 29/764 |
| 4,615,575 | 10/1986 | Kossor | 339/82 |

*Primary Examiner*—Carl E. Hall
*Attorney, Agent, or Firm*—John A. Beehner

[57] ABSTRACT

An electronic pin pulling tool has an elongated shank having opposite hook and handle ends. A pin engagement tip extends transversely from the hook end of the shank and has a free end, an opposite shank end, an outer pushing surface facing away from the handle end and an inner pulling surface facing the handle end of the shank. The shank end of the tip is recessed inwardly from the pushing surface by a distance generally equal to the distance between the pushing and pulling surfaces to facilitate insertion of the tip into the open end of an electronic pin with minimal inclination of the shank relative to the pin. To accommodate a particular pin size, the transverse distance from the free end of the tip of the tool to the opposite surface of the shank in the plane of the inner pulling surface is greater than the inside diameter of the lip of the pin and less than the inside diameter of the sleeve of the pin.

10 Claims, 2 Drawing Sheets

ELECTRICAL PIN PULLING TOOL

BACKGROUND OF THE INVENTION

The present invention is directed generally to a tool for inserting pins into electronic connectors and more particularly to a tool for pulling a depressed female pin back to its installed working position adjacent the free end of a connector without disassembly of the connector.

The female part of an electronic connector has a plurality of sockets opening through the front end thereof and wires inserted into the rearward end for connection to female pins within the sockets Perhaps nine out of ten problems associated with such connectors concern pushed pins, namely a female pin depressed within its respective socket rearwardly of its installed working position adjacent the front end of the connector. Another problem is a broken pin which may be visually undetectable from an examination of the assembled connector.

Servicing such connectors is very expensive and inconvenient due to the substantial time required by electronics maintenance personal to repair the connectors. Further expense results from damage to the connectors which can easily happen during disassembly and repair.

Most connectors are not easily accessible from the rear which therefore makes reinsertion of an inadvertently pushed pin a long and drawn out process. If a pin is pushed over its lock, the unit or connector must be disassembled in order to reach the rear of the connector so that a sometimes unreliable conventional insertion tool can be used to push the pin forwardly to its fully installed working position. The amount of time wasted disassembling the unit could vary from five minutes to several hours. Due to the delicate nature of most electronic connectors, such disassembly may result in damage to internal parts. Such problems are increased twofold in actual practice wherein a connector is generally disassembled to find the problem whereupon it is reassembled to return the aircraft or other equipment to service while parts are ordered. The connector is then disassembled again to install parts such as the replacement of broken pin.

Accordingly, a primary object of the invention is to provide an electronic pin pulling tool capable of engaging and pulling a pin forwardly in a connector without disassembly of the connector.

Another object is to provide such a tool which enables trouble shooting of electronic connectors without disassembly of the connectors.

Another object is to provide such a tool which may be inserted into a connector socket with little or no inclination of the tool relative to the axis of the socket for engaging a depressed pin.

Another object is to provide such a tool which is capable of engaging and pulling a pin without contacting or bending the conductors within the pin.

Another object is to provide such a tool which is simple and rugged in construction, economical to manufacture and efficient in operation.

Finally, another object of the invention is to provide a method of inserting female electronic pins into an electronic connector without disassembly of the connector.

SUMMARY OF THE INVENTION

A tool for pulling a female electronic pin into a connector includes an elongated shank having opposite hook and handle ends. A handle is provided on the handle end to facilitate gripping the shank and applying a pulling force in a direction toward the handle end. A pin engagement tip extends transversely from the hook end of the shank, which tip has an outer pushing surface facing away from the handle end, an inner pulling surface facing said handle end, a free end and an opposite shank end. The shank end of the tip is recessed inwardly from the pushing surface by a distance generally equal to the distance between the pushing and pulling surfaces to facilitate insertion of the tip into the open end of an electronic pin with minimal inclination of the shank relative to the pin.

The invention is furthermore directed to the combination of the tool with a female electronic pin including a sleeve having a regularly inwardly protruding lip adjacent the free open end thereof and a conductor within and spaced from the open end of the sleeve. To accommodate such pin, the transverse distance from the free end of the tip of the tool to the opposite surface of the shank in the plane of the inner pulling surface is greater than the inside diameter of the lip of the pin and less than the inside diameter of the sleeve of the pin. The tip of the tool is generally rigid so as not to bend when a pin is being pulled.

The invention is furthermore directed to the method of inserting a female electronic pin into an electronic connector including inserting the tip of the tool into the open end of a female pin with little or no inclination of the shank of the tool relative to the longitudinal axis of the pin, engaging the inner pulling surface of the tip with the interior surface of the lip of the pin and engaging the opposite surface of the shank against the lip to maintain engagement of the tip against said lip, and pulling the tool and pin therewith in the direction toward the handle end of the shank to pull the pin forwardly to its installed working position. The tool is then released from the pin by inclining the tool relative to the sleeve and disengaging the tip of the tool from the lip of the pin.

DESCRIPTION OF A PREFERRED EMBODIMENT

Figure 1:
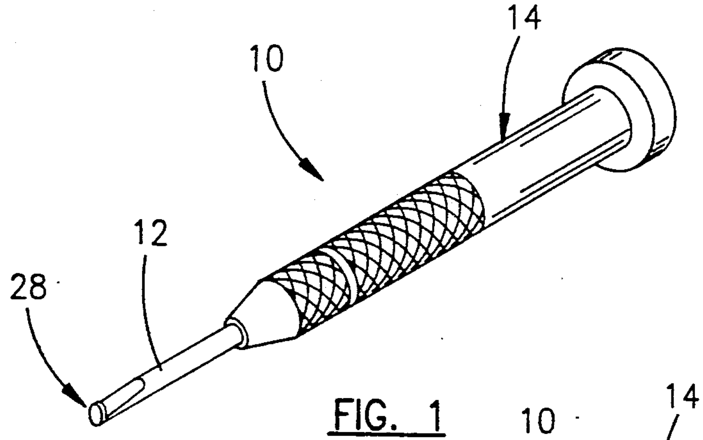
FIG. 1 is a perspective view of a preferred embodiment of the tool.
Figure 2:
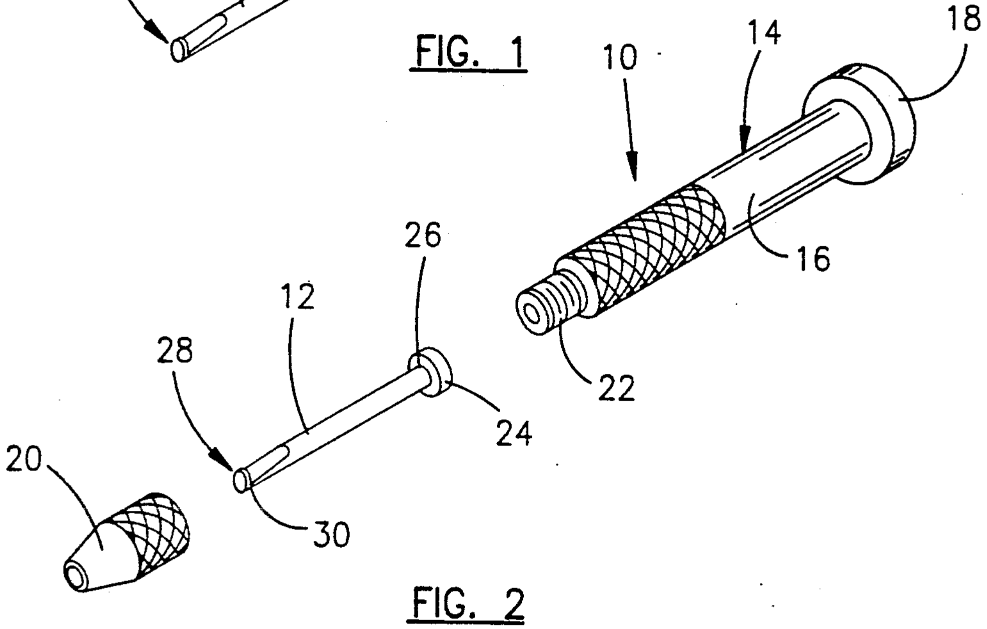
FIG. 2 is an exploded perspective view of the tool of FIG. 1.

The electronic pin pulling tool 10 of the present invention is illustrated in FIGS. 1–4 as including an elongated shank 12 protruding from one end of a handle 14. In the preferred embodiment, the handle may be a conventional jewelers screwdriver handle including a base 16 with a swivel member 18 at one end and a separate chuck 20 threadable onto the opposite end 22 of base 16. Shank 12 may therefore have a head 24 formed on the handle end 26 thereof for engagement by the chuck 20 for securing it relative to the handle base 16.

A pin engagement tip 28 extends transversely outwardly from the opposite hook end 30 of shank 12. Tip 28 has an outer pushing surface 32 facing away from the handle end 26, an inner pulling surface 34 facing handle end 26, a free end 36 and an opposite shank end 38.

Figure 3:
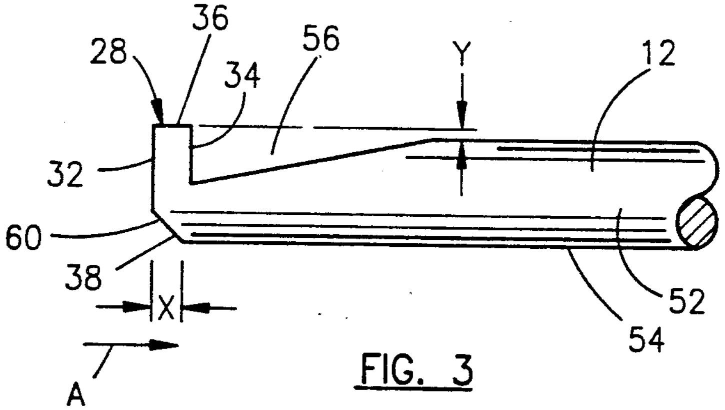
FIG. 3 is a partial enlarged side elevational view of the hooked tip of the tool.

The shank end 38 of tip 28 is recessed inwardly in the direction of arrow "a" in FIG. 3 from the pushing surface 32 by a distance, labeled "X", generally equal to the distance between the pushing and pulling surfaces 32 and 34. This recess facilitates insertion of the tip 28 into the open end 40 of a female electronic pin 42 with minimal inclination of the shank 12 relative to a central longitudinal axis 44 through the pin.

Figure 4:
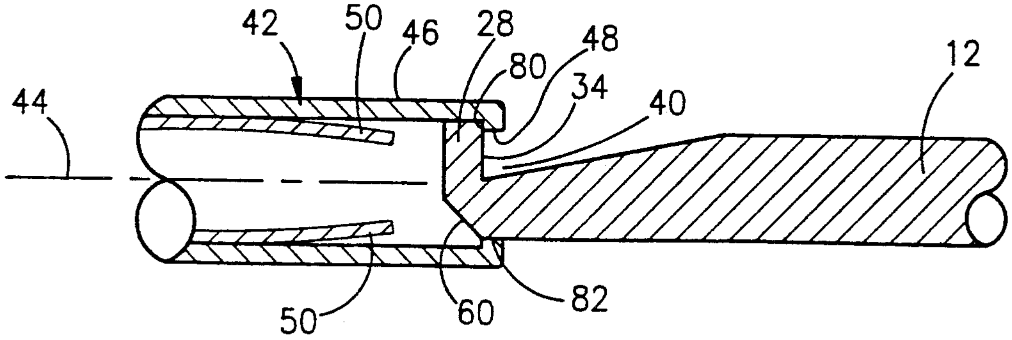
FIG. 4 is a partial enlarged side sectional view of the tip of the tool inserted within the open end of a female pin.

Referring to FIG. 4, the female electronic pin 42 includes a sleeve 46 having a radially inwardly protruding lip 48 adjacent the free open end 40. The lip 48 is generally formed as a continuous collar around open end 40 and may be machined as a turned in portion of the sleeve 46. FIG. 4 illustrates that the conductor 50 within the pin 42 is spaced from the lip 48, thereby affording room for insertion of tip 28 without contacting the conductor 50. The conductor may be formed of brass or another highly conductive material. The fact that the tool remains clear of the conductor during use avoids any distortion of the conductor which could damage the pin.

Referring to FIG. 3, the shank 12 may be formed from a solid rod 52 which is machined at 54 to form the somewhat V-shaped recess which defines the inner pulling surface 34 of tip 28. The surface of rod 52 is then machined so that the free end 36 of tip 28 protrudes outwardly of the outer surface of shank 12 by a distance "y". Both sides of the tip are machined to give it a generally upright oval shape which can be easily inserted generally upright oval shape which can be easily inserted into the open end of a pin. The shank end 38 of tip 28 is then recessed inwardly as at 60 to enable insertion of the tool into a pin with little or no bending of the tool relative to the axis of the pin.

The shank is preferably formed with a carbide tip which is substantially rigid but may bend slightly without breaking.

Figure 5:
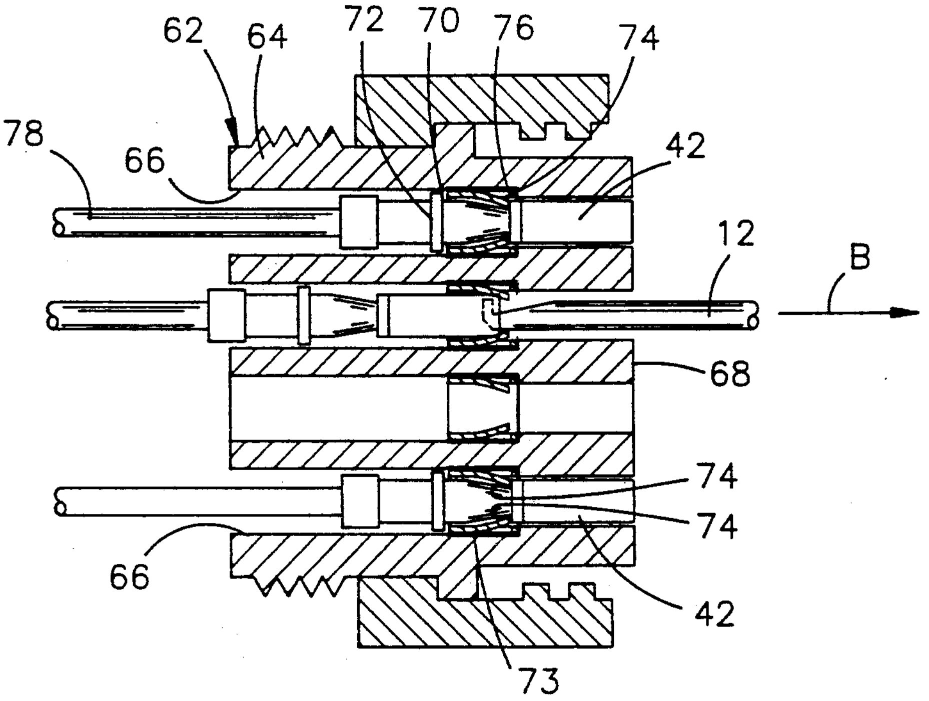
FIG. 5 is a cross-sectional view of a connector including female pins showing the use of the tool for pulling a displaced pin back into the connector.
Figure 6:
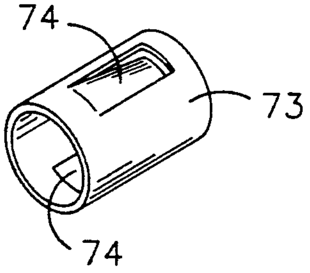
FIG. 6 is an enlarged front view of the retainer ring for releasably securing a pin within the connector.
Figure 7:
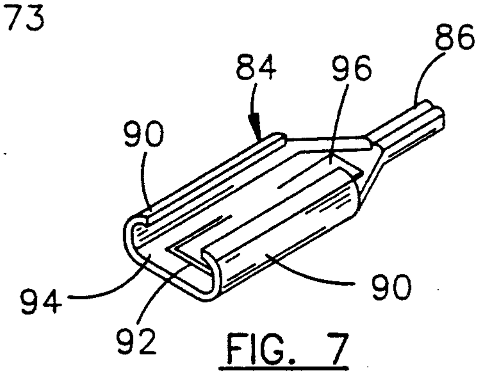
FIG. 7 is a perspective view of an alternate connector which may be positioned with the tool of the invention.

FIG. 5 illustrates an electronic connector 62 including a body 64 having a plurality of parallel sockets 66 extending therethrough. Each socket includes some type of lock means for engaging a pin 42 and securing it in its fully installed working position adjacent the front end 68 of the connector. In the illustrated embodiment, each socket is provided with a shoulder 70 which is engageable with a collar 72 on the pin to limit forward movement of the pin to the working position. Each socket also includes a generally tubular insert 73 friction fit with the generally rubber-like socket and including a pair of spring clips 74 for a snap fit engagement behind a rearward end of pin sleeve 46 to releasably secure the pin in the connector. Each pin 42 and the associated wire 78 to which it is attached may be withdrawn from the rearward end of the socket upon application of appropriate force, as is conventional. Occasionally, a bent male pin or foreign matter within the socket may cause a pin 42 to be depressed into the socket from the working position illustrated for the top and bottom pins in FIG. 5. In that instance, the tool 10 of the invention is used to pull the pin 42 forwardly in the direction of arrow B in FIG. 5, back to its working position without disassembly of the connector 62. The tip 28 is inserted into the open end 40 of pin 42 with little or no inclination of the shank 12 relative to the longitudinal axis of the pin sleeve 46. This is necessary since the socket generally interferes with any such inclination of the shank 12.

The inner pulling surface 34 of tip 28 is engaged with the interior surface 80 of lip 48. The recess 60 at the shank end of tip 28 enables movement of the free end 36 of tip 28 inwardly beyond the lip before forcing the tip upwardly behind the lip for engagement of the opposite surface 82 of the shank against the lip 48, as shown in FIG. 4, to maintain engagement of the tip 28 against the lip. The tool 10 and pin 42 are then pulled outwardly in the direction from the tip end to the handle end of the shank, as indicated by arrow B in FIG. 5, to pull the depressed pin back to its installed working position. With the shank substantially withdrawn from the connector socket 66, the tool is then easily inclined relative to the pin sleeve 46 for disengaging the tip 28 from lip 48 of the pin.

All connectors are not the same size, with the result that different sized tools are required for different sized pins. The inventor has found that four different sized tools will fit most female pins and one size of tool is applicable for all male pins. One shank may be sized to accommodate a 22 gage pin which is perhaps the most common pin size. Another shank may be sized to accommodate a slightly larger 20 gage pin. Smaller shanks may be sized to accommodate the miniature 24 and 26 gage pins.

Figure 8:
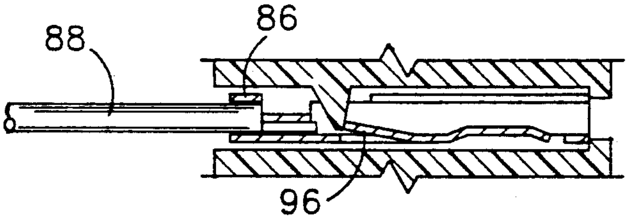
FIG. 8 is a partial side sectional view showing the pin of FIG. 7 properly situated within a connector.
Figure 9:
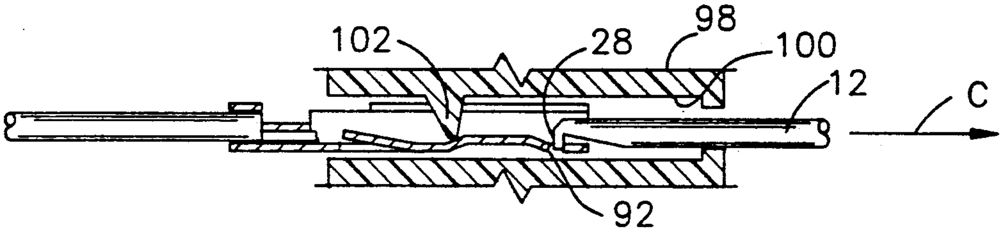
FIG. 9 is a partial sectional side view showing use of the tool for pulling the pin of FIG. 7 into a connector.
Figure 10:
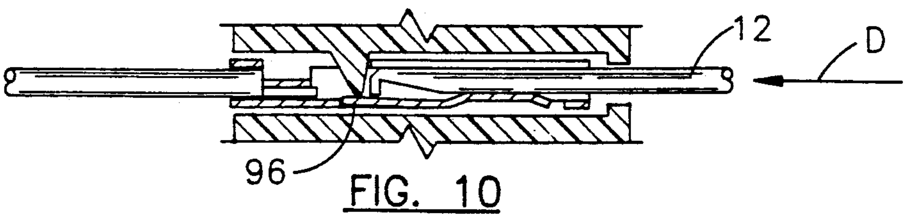
FIG. 10 is a partial sectional view showing the pin of the invention in use for pushing the pin of FIG. 7 out of a connector.

Whereas the tool 10 of the invention may find its most common use with generally cylindrical female pins of the type shown in FIGS. 4 and 5, it can also be used to reposition any other pins which present an engagement surface for the tip. An example is the telephone switch connector pin 84 illustrated in FIGS. 7–10 That pin has a rearward end 86 adapted to be crimped onto a wire 88. The forward portion of the pin has rolled up sides 90, a transverse slot 92 in bottom wall 94 and an upwardly and rearwardly extending retention tab in the same bottom wall. This pin 84 is adapted for insertion into a connector 98 having a socket 100 including a downward projection 102 for engagement by retention tab 96 in the fully installed working position of the pin, as illustrated in FIG. 8. The tool actually has two uses for such a pin. As illustrated in FIG. 9, the tip 28 is engageable within slot 92 to pull the pin forwardly within the socket in the direction of arrow C in FIG. 9. Alternately, as illustrated in FIG. 10, the tool may be used to depress the tab 96 for pushing the pin rearwardly out of the socket in the direction of arrow D.

Whereas the tool of the invention has been shown and described in connection with a preferred embodiment thereof, it is apparent that many modifications, additions and substitutions may be made which are within the intended broad scope of the appended claims. For example, the tip 28 need not have the oval shape of shank 12 and the cross sectional shape of shank 12 may be other than the round shape illustrated in the drawings. The recess formed by machined surface 54 which defines the inner pulling surface 34 of tip 28 is advantageous in that it enables a maximum diameter shank for a given tip size. If the pulling surface 34 of tip 28 is stepped or shaped other than the planar radial surface illustrated in the drawing, it is that portion which faces rearwardly and actually engages the lip of a pin which is to be construed as the inner pulling surface for purposes of this invention. It is the positional relation of that surface to the recess 60 at the shank end of the tip 28 which enables insertion of the tool into the open end of a pin with little or no inclination of the tool relative the pin. Likewise, the transverse dimension of the tip in the plane through the inner pulling surface 34 is important for locking the tip against the inner surface of a pin lip so that it does not simply slip off when the tool is pulled. The simultaneous engagement of the pulling surface of the tip and opposite surface of the shank with the lip prevents any transverse movement of the tip which would cause the tip to be disengaged from the lip of the pin. Accordingly, whatever force is required for pulling the pin forwardly may be applied without slippage of the tool.

Thus there has been shown and described an electronic pin pulling tool and method which accomplish at least all of the stated objects.

I claim:

1. A tool for engaging the open end of an electronic pin for inserting the pin into an electronic connector, comprising an elongated shank having a hook end and an opposite handle end, handle means on said handle end of said shank to facilitate gripping said shank and applying a pulling force in a direction away from said hook end toward said handle end, a pin engagement tip extending transversely from said hook end of the shank, said tip having an outer pushing surface facing away from said handle end and an inner pulling surface facing said handle end, a free end and an opposite shank end, the shank end of said tip being recessed inwardly from said pushing surface by a distance generally equal to the distance between said pushing and pulling surfaces to facilitate insertion of said tip into the open end an electronic pin with minimal inclination of the shank relative to the pin.

2. The tool of claim 1 wherein said tip is generally rigid relative to said shank.

3. The tool of claim 2 wherein the side of the shank adjacent the free end of the tip is recessed transversely inwardly to at least partially define said inner pulling surface of the tip.

4. The tool of claim 3 wherein the free end of said tip protrudes only slightly outwardly of said shank.

5. A tool for use with a female electronic pin including a sleeve having a radially inwardly protruding lip adjacent the free open end thereof and a conductor within and spaced from the open end of the sleeve, a tool for pulling said female pin into an electronic connector, said tool comprising an elongated shank having a hook end and an opposite handle end, handle means on said handle end of said shank to facilitate gripping said shank and applying a pulling force in a direction from said hook end to said handle end, a pin engagement tip extending transversely from said hook end of the shank, said tip having an outer pushing surface facing away from said handle end and an inner pulling surface facing said handle end, a free end and an opposite shank end, the shank end of said tip being recessed inwardly from said pushing surface by a distance generally equal to the distance between said pushing and pulling surfaces to facilitate insertion of said tip into the open end of the female electronic pin with minimal inclination of the shank relative to the pin, the transverse distance from the free end of said tip to the opposite surface of the shank in the plane of said inner pulling surface being greater than the inside diameter of said lip and less than the inside diameter of said sleeve.

6. The tool of claim 5 wherein said tip is generally rigid relative to said shank.

7. The tool of claim 6 the side of the shank adjacent the free end of the tip is recessed transversely inwardly to at least partially defined said inner pulling surface of the tip.

8. The tool of claim 7 wherein the free end of said tip protrudes only slightly outwardly of said shank.

9. The tool of claim 5 wherein the distance between the pushing and pulling surfaces of said tip is less than the longitudinal spacing of the conductor from the radial inwardly protruding lip adjacent the free open end of the sleeve so that the tip need not contact the conductor for pulling the pin into an electronic connector.

10. The tool of claim 9 wherein said radially inwardly protruding lip comprises a collar extending substantially continuously about the periphery of the open end of the pin sleeve.

* * * * *